(12) United States Patent
Bailey

(10) Patent No.: US 6,367,025 B1
(45) Date of Patent: Apr. 2, 2002

(54) PASS-GATE INPUTS THAT TEMPORARILY HOLD STATE ON A HIGH INPUT IMPEDANCE, STROBED CMOS DIFFERENTIAL SENSE AMPLIFIER

(75) Inventor: Daniel W. Bailey, Northborough, MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/241,000

(22) Filed: Feb. 1, 1999

(51) Int. Cl.$^7$ ................................................ G06F 1/04
(52) U.S. Cl. ...................... 713/400; 713/600
(58) Field of Search ............................... 713/400, 503, 713/600; 327/51, 52, 57, 91

(56) References Cited

U.S. PATENT DOCUMENTS

| | | | |
|---|---|---|---|
| 4,910,713 A | | 3/1990 | Madden et al. .............. 365/189 |
| 5,355,340 A | * | 10/1994 | Coker et al. ................. 365/200 |
| 5,963,060 A | * | 10/1999 | Varadarajan et al. .......... 327/55 |
| 5,963,485 A | * | 10/1999 | Brady et al. ............ 365/189.11 |
| 5,986,917 A | * | 11/1999 | Lee ............................. 365/103 |

OTHER PUBLICATIONS

Jiang, June et al., "High–Performance, Low–Power Design Techniques for Dynamic to Static Logic Interface," Proceedings 1997 International Symposium on Low Power Electronics and Design, Monterey, CA, Aug. 18–20, 1997, pp. 12–17.

Chuang, Ching–Te et al. "SOI for Digital CMOS VLSI: Design Considerations and Advances," Proceedings of the IEEE, 86(4): 689–720 (Apr. 1998).

Glasser, Lance A., and Dobberpuhl, Daniel W., "The Design and Analysis of VLSI Circuits," (MA: Addison$_{13}$Wesley Publishing), pp. 286–289 (1985).

Matson, M. et al., "A 600MHz Superscalar Floating Point Processor," Paper on EV6 Fbox given at European Solid–State Circuits Conference, (Sep. 1998).

Montanaro, James et al., "A 160–MHZ, 32–b, 0.5–W CMOS RISC Microprocessor," IEEE Journal of Solid–State Circuits, 31(11) 1703–1714 (Nov. 1996).

\* cited by examiner

Primary Examiner—Dennis M. Butler
(74) Attorney, Agent, or Firm—Hamilton, Brook, Smith & Reynolds, P.C.

(57) ABSTRACT

A method and apparatus are provided for improving the data hold timing requirement of the sense amplifier by coupling a pass-gate to its data input ports. Each pass-gate receives a logic level that has developed on an input data signal. When the data is valid, a control signal is asserted that causes the pass-gate to latch the logic level at the input of the sense amplifier. While that logic level is latched, the sense amplifier can generate a corresponding latched output signal and the data signal can transition to a new logic level. Therefore, the pass-gate maintains the logic level at the input of the sense amplifier for the duration of the data hold timing requirement. The pass-gate can be a level-sensitive latch that latches said first logic level in response to the assertion level of the control signal. It includes a first transistor having a drain terminal connected to the data signal, a source terminal connected to the sense amplifier and a gate terminal connected to the control signal. That transistor can be a PMOS or NMOS transistor.

32 Claims, 10 Drawing Sheets

CLOCKED PASS GATES

PASS-GATE INPUTS THAT TEMPORARILY HOLD STATE ON A HIGH INPUT IMPEDANCE, STROBED CMOS DIFFERENTIAL SENSE AMPLIFIER

BACKGROUND OF THE INVENTION

Generally speaking, computer systems typically include one or more central processor units (CPUs). Each CPU includes many signal paths that convey data between functional units that operate on that data. Such data is typically conveyed using a transfer cycle having a specified timing structure. That timing structure dictates a time period when the data to be transferred will be valid. Accordingly, the data is captured while it is valid and held for a specified amount of time. Such data capture can be performed using a number of edge triggered latches.

Within a CPU, edge triggered latches are commonly implemented using a circuit referred to as a "sense amplifier". Sense amplifiers are designed to sense the logic level of a data signal and to output a latched version of that logic level. Because the above mentioned time period is typically specified with respect to a particular clock cycle, an edge triggered latch typically samples or "senses" the data on the rising edge of that clock cycle. The data is latched, i.e. held at the output of the sense amplifier, until the falling edge of that clock cycle or until the rising edge of the next clock cycle, depending upon its design. Until the next rising edge of the clock, new data can be asserted on the signal line without affecting the latched data.

An ideal sense amplifier would latch the data immediately upon the rising edge of the associated clock cycle. In practice, however, the latching operation occurs over a finite amount of time during which the data must remain stable. That finite amount of time is defined by "data set-up" and "data hold" timing requirements. Accordingly, the data signal presented to the sense amplifier must satisfy the data set-up and data hold timing requirements in order for the associated logic levels to be properly latched.

The data set-up timing requirement refers to the amount of time that the data must remain stable before the sense amplifier latches it. The data set-up time is typically specified in relation to the rising edge of the above mentioned clock cycle. The data hold timing requirement refers to the amount of time that the data signal must remain stable after the rising edge of that clock cycle.

Prior art sense amplifiers have demonstrated a reduction, or improvement, in the data hold timing requirement at the expense of significantly increased data set-up timing requirements. Accordingly, while the data hold timing requirement has been improved, the overall access cycle time for the sense amplifier is effectively unchanged. Therefore, the rate at which data can be presented to the sense amplifier is also unchanged and, hence, performance is not improved.

SUMMARY OF THE INVENTION

The sense amplifier of the present invention provides a considerable reduction of the data hold timing requirement without a concomitant increase in the data set-up timing requirement. Accordingly, the overall access time for that sense amplifier is significantly improved, thereby increasing the rate at which data can be presented to the sense amplifier.

More specifically, a method and apparatus are provided for improving the data hold timing requirement of the sense amplifier by coupling a pass-gate to each of its data input ports. Each pass-gate receives a logic level that has developed on an input data signal. When the data is valid, a control signal is asserted that causes the pass-gate to latch the logic level at the input of the sense amplifier. While that logic level is latched, the sense amplifier can generate a corresponding latched output signal and the data signal can transition to a new logic level. Therefore, the pass-gate maintains the logic level at the input of the sense amplifier for the duration of the data hold timing requirement.

The pass-gate can be a level-sensitive latch that latches said first logic level in response to the assertion level of the control signal. It includes a first transistor having a drain terminal connected to the data signal, a source terminal connected to the sense amplifier and a gate terminal connected to the control signal. That transistor can be a PMOS or NMOS transistor.

Also, the pass-gate can include a second transistor that is connected in parallel with the first transistor. That second transistor can be the opposite type of transistor (NMOS or PMOS) as the first transistor.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Generally, the sense amplifier of the present invention provides significantly increased performance due to a considerable reduction of the data hold timing requirement. Also, the present invention does not significantly increase the data set-up timing requirement to achieve that result. Accordingly, the overall access time for the sense amplifier is significantly improved, thereby increasing the rate at which data can be presented to the sense amplifier.

I. A Computer System

Figure 1:
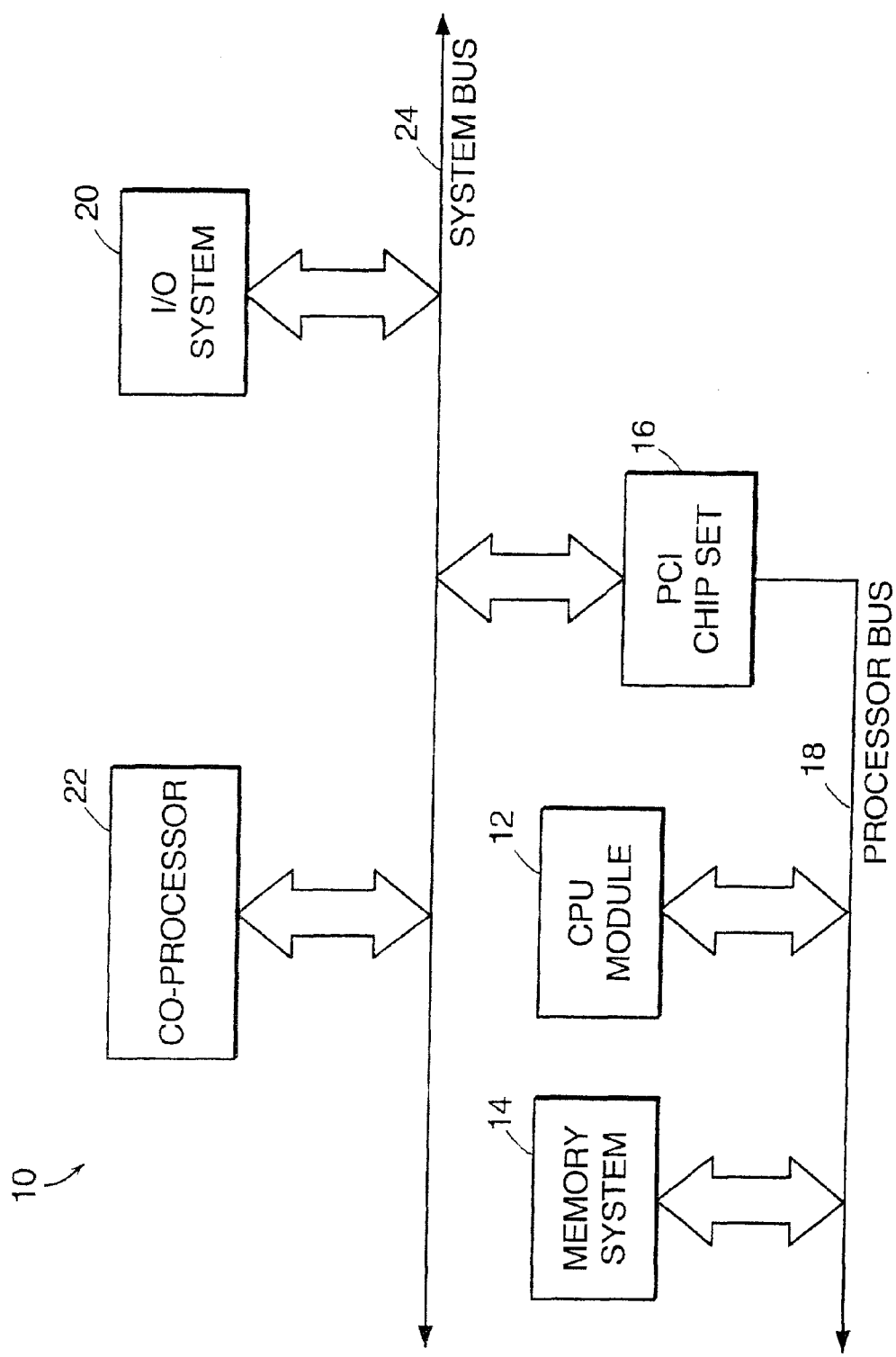
FIG. 1 is a schematic drawing of a computer system including a central processing module in which the present invention can be used.

FIG. 1 is a schematic diagram of a computer system 10 that includes a central processing unit (CPU) module 12, a memory system 14 and a PCI chip set 16 connected by a processor bus 18. The PCI chip set 16 is further connected to an I/O system 20 and a co-processor module 22 by a system bus 24. Central processing module 12 can include a number of sense amplifiers for use with the present invention.

Figure 2:
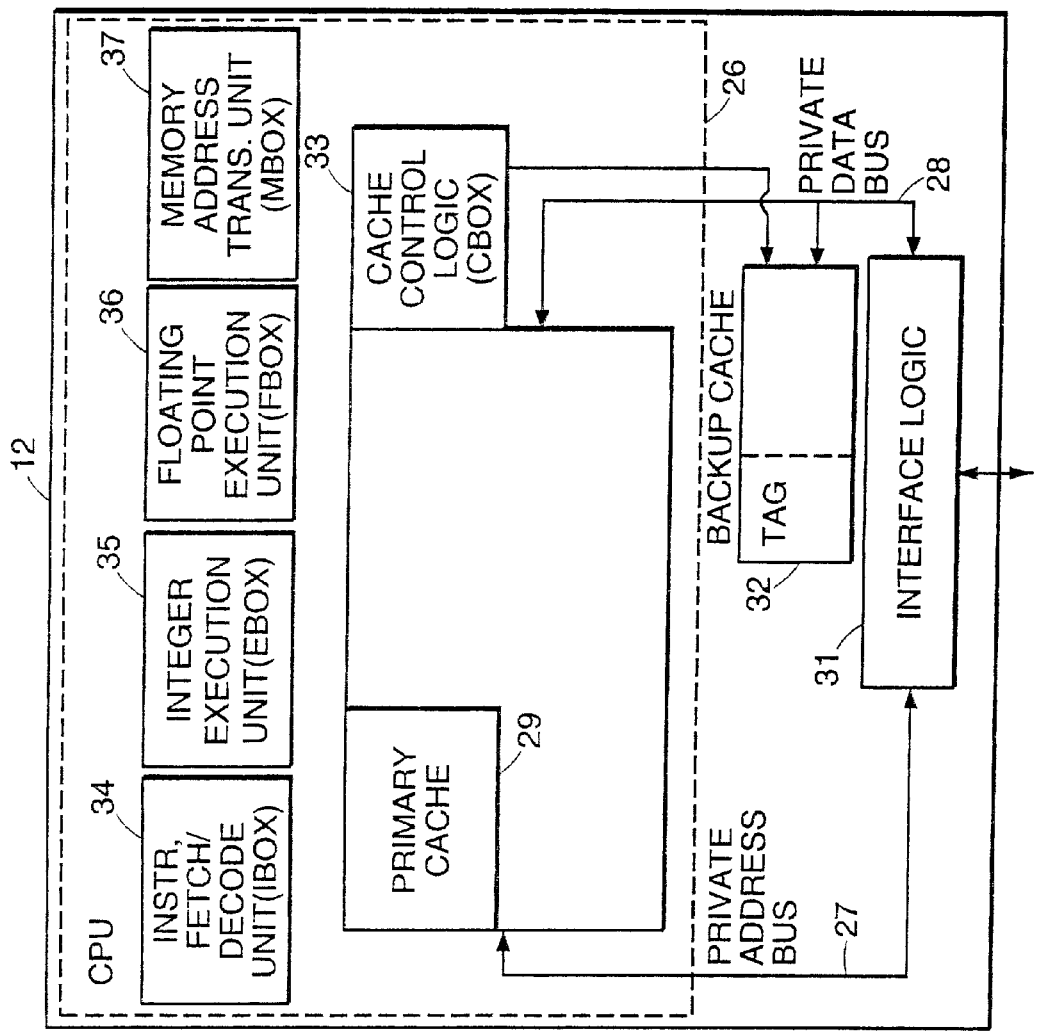
FIG. 2 is a schematic diagram of the central processing module of FIG. 1.

Referring now to FIG. 2, central processing module 12 is shown to include a CPU 26. A private address bus 27 and a private data bus 28 within CPU 26 connects a primary cache 29 and a system bus interface 31. The private data bus 28 connects the CPU 26 to a backup cache (Bcache) 32 that, along with the primary cache 29, is controlled by the Cache Control and Bus Interface unit 33.

CPU 26 further includes several logic circuits that enable it to perform the major operations that the computer system 10 requires. The Ibox 34, or Instruction Fetch and Decode Unit, controls instruction prefetching, instruction decoding, branch prediction, instruction issuance, and interrupt handling. The Ebox 35, or Integer Execution Unit, handles the functions of addition, shifting, byte manipulation, logic operations, and multiplication for integer values stored in the system. These same operations, for floating point values, are controlled by the Fbox 36, or Floating Point Execution Unit. The Mbox 37, or Memory Address Translation Unit, translates virtual addresses, generated by programs running on the system, into physical addresses which are used to access locations in the computer system. Lastly, the Cbox 33, or Cache Control and Bus Interface Unit, controls the primary cache 29 and backup cache 32. It also controls the private data bus, private address bus, memory related external interface functions, and all accesses initiated by the Mbox 37.

Each of the circuits mentioned above include sense amplifiers to detect and latch logic levels of transferred data signals. Accordingly, sense amplifiers or edge-triggered latches are widely used in many different areas of CPU module 12. In order to increase the data transfer speed, the performance of the sense amplifiers must also be increased.

II. An Inventive Sense Amplifier

Figure 3:
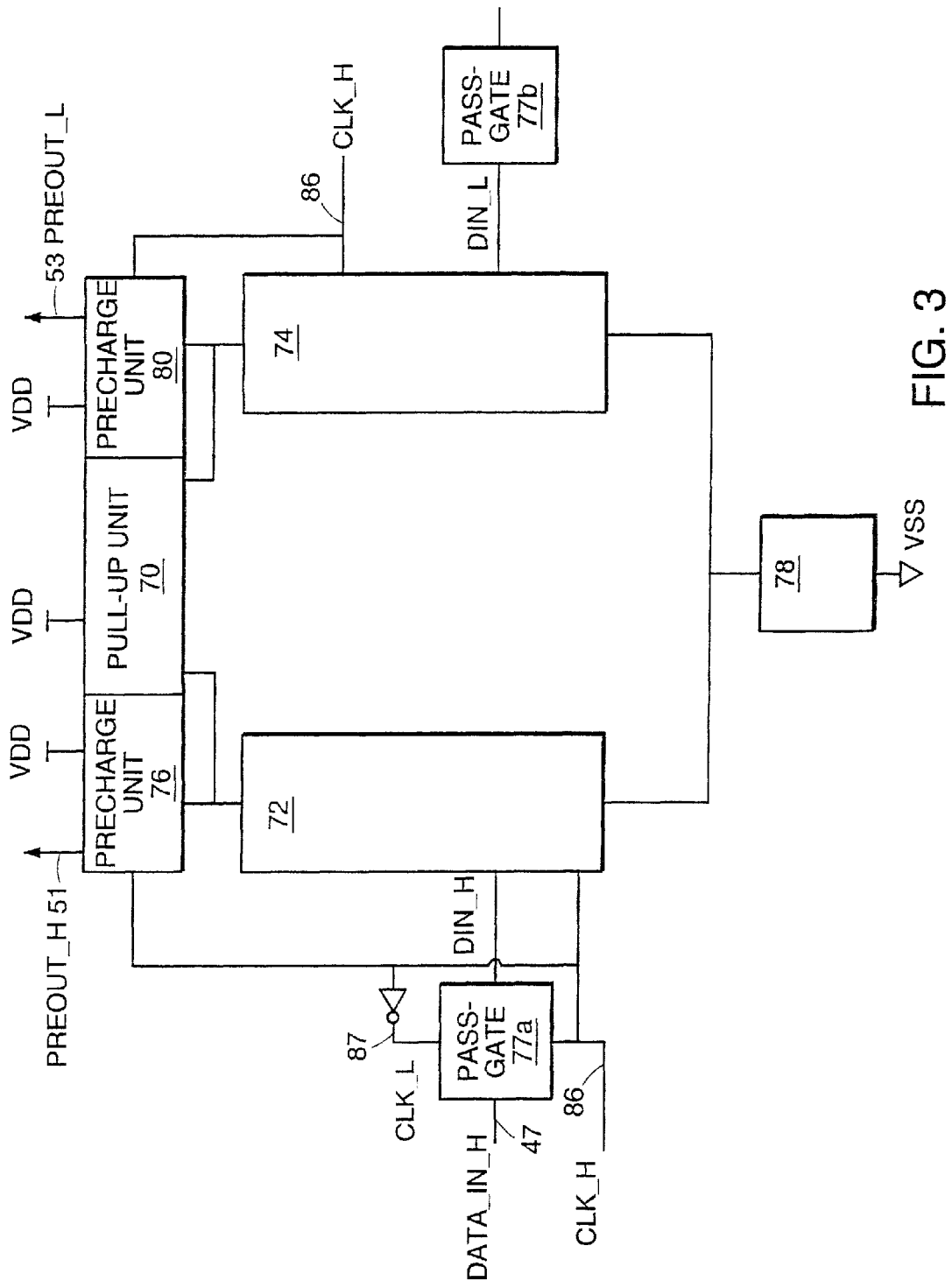
FIG. 3 is a functional block diagram of a sense amplifier that can be practiced in the central processing module of FIG. 2, according to the present invention.

Referring now to FIG. 3, a functional block diagram of a sense amplifier 44 that demonstrates an improved data hold timing requirement is shown. Sense amplifier 44 provides such an improvement by including a level sensitive latch, implemented here as a "pass-gate", at each data receiving terminal. The output of a level sensitive latch mirrors a data signal presented at its input terminal when an associated control signal reaches a certain logic level, e.g. a logic high level. Such a level sensitive latch latches the logic level of that data signal when the control signal reaches a complementary logic level, e.g. a logic low level. By contrast, an edge sensitive latch (44a) latches the logic level of that data signal during the control signal's transition from one logic level to a complementary logic level. Typically, level sensitive latches and edge sensitive latches are not combined in this sequence due to their significantly different methods of operation.

The above mentioned pass-gates dynamically latch the logic level of the data signals for an amount of time that allows the sense amplifier to resolve the output signals preout_h 51 and preout_53 to the appropriate rail-to-rail voltages. Once the pass gates have latched the logic levels of the data signals, the data signals can transition to subsequent logic levels. In other words, while the voltage levels of output signals preout_h 51 and preout_l 53 are being established, new data is being presented to the sense amplifier.

Sense amplifier 44 is also shown to include pre-charge units 76 and 80 that are used for initializing or "precharging" the internal nodes of sense amplifier 44 to predetermined logic levels. Sense amplifier 44 includes a pair of discharge paths, the data low discharge path 72 and the data high discharge path 74, connected to an evaluate unit 78 and to a pull-up unit 70. Those discharge paths 72 and 74 are connected by a charge sharing device 77 for balancing charges developed thereon, as will be described.

The pre-charge units are connected to a CLK_H signal 86 and pre-charge the internal nodes when that CLK_H signal 86 transitions to a logic low level. At the same time, pass-gates 77a and 77b are turned-on, thereby allowing the logic levels on signals data_in_h 47 and data_in_l 46 to develop on nodes DIN_H and DIN_L respectively. When the CLK_H signal 86 transitions to a logic high level, pass-gates 77a and 77b are turned-off and evaluate unit 78 is turned-on. Because, pass-gates 77a and 77b are turned-off, the voltage levels on nodes DIN_H and DIN_L are dynamically latched at the inputs of discharge paths 72 and 74. In other words, the combination of pass-gates 77a and 77b with nodes DIN_H and DIN_L operates much like a dynamic memory cell storage location.

When evaluate unit 78 is turned-on, it allows current to flow from discharge paths 72 and 74 to Vss. Depending upon the logic levels developed on nodes DIN_H and DIN_L, one of the discharge paths 72 or 74 will allow current to flow at a faster rate. Responsively, one of the associated output signals, preout_h 51 or preout_l 53 will be discharged at a faster rate. The output signal 51 or 53 that discharges at the faster rate will be detected and allowed to continue to discharge. The remaining output signal 51 or 53 will be pulled to Vdd by the pull-up unit 70. Accordingly, a rail-to-rail voltage signal having the same polarity as DIN_L will be latched on the preout_l signal 53. Also, a rail-to-rail voltage signal having the same polarity as DIN_H, will be latched on output signal preout_h 51.

Figure 4:
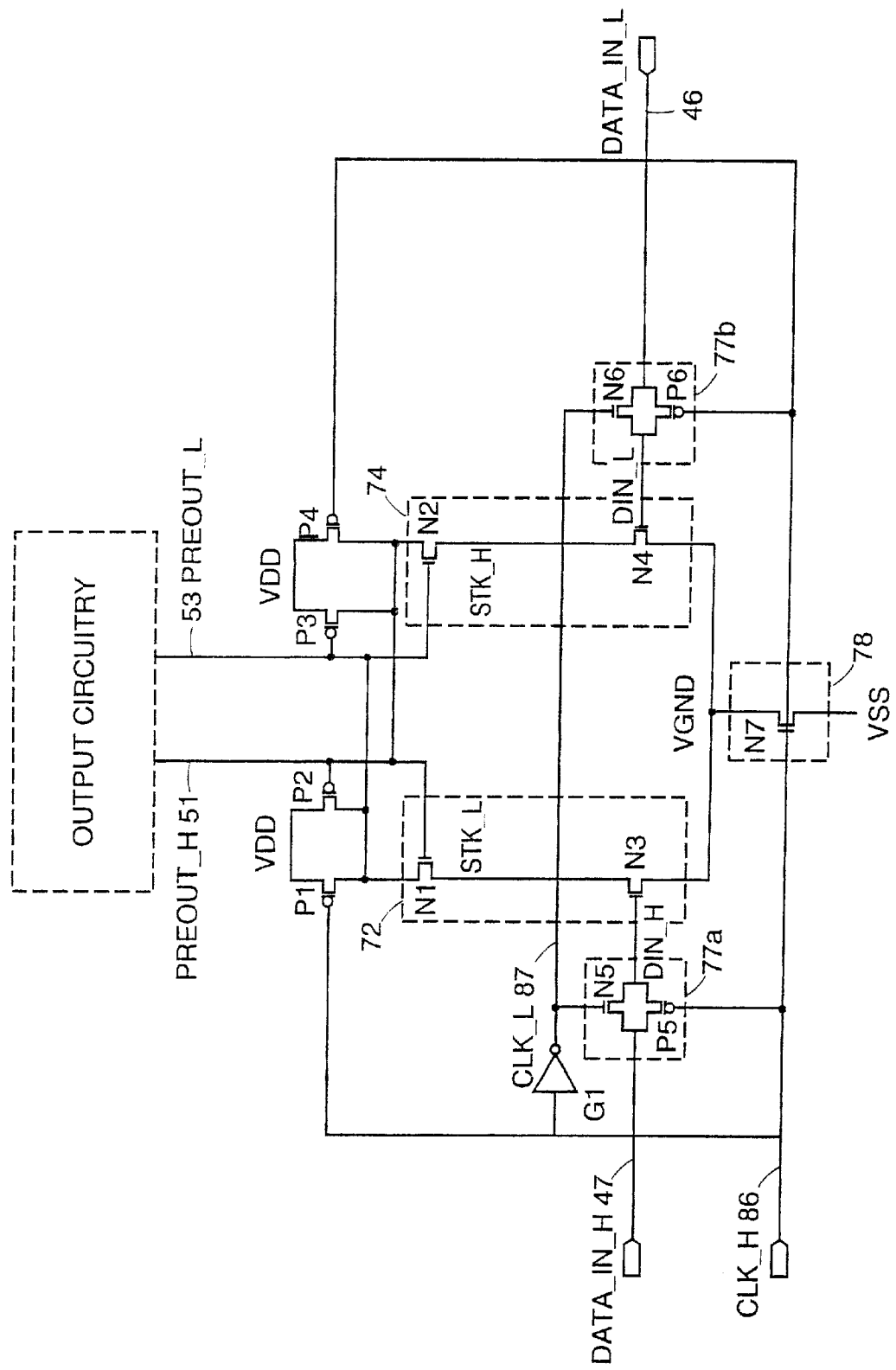
FIG. 4 is a schematic diagram of an embodiment of the sense amplifier of FIG. 3, according to the present invention.

Referring now to FIG. 4, a schematic diagram of an embodiment of a sense amplifier according to the present invention is shown. Data signals data_in_l 46 and data_in_h 47 are connected to pass gates 77a and 77b, respectively. Pass gate 77a includes an NMOS transistor N5 connected in parallel with a PMOS transistor P5, i.e. the source and drain terminals of N5 and P5 are connected. The common source terminals are connected to data signal data_in_h 47 such that when CLK_H signal 86 transitions to a logic low level (and signal CLK_L 87 transitions to a logic high level), initiating the sense amplifier's pre-charge operation, transistors N5 and P5 convey the associated logic level to node DIN_H. Node DIN_H is further connected to the gate terminal of data input transistor N3.

Further, Pass gate 77b includes an NMOS transistor N6 connected in parallel with a PMOS transistor P6. The common source terminals are connected to data signal data_in_l 46 such that when CLK_H signal 86 transitions to a logic low level (and signal CLK_L 87 transitions to a logic high level), transistors N6 and P6 convey the associated logic level to node DIN_L. Node DIN_L is further connected to the gate terminal of data input transistor N4.

When CLK_H signal 86 transitions to a logic high level, initiating the sense amplifier's sensing operation, transistors N5, P5, N6 and P6 are responsively turned-off. Accordingly, the logic levels developed on nodes DIN_H and DIN_L will not be able to discharge and are therefore maintained at the input of sense amplifier 44 while the output signals 51 and 53 are generated. At the same time, logic levels associated with new data can be developed on signals data_in_h 47 and data_in_l 46.

IV, Pre-Charge Operation

Figure 5:
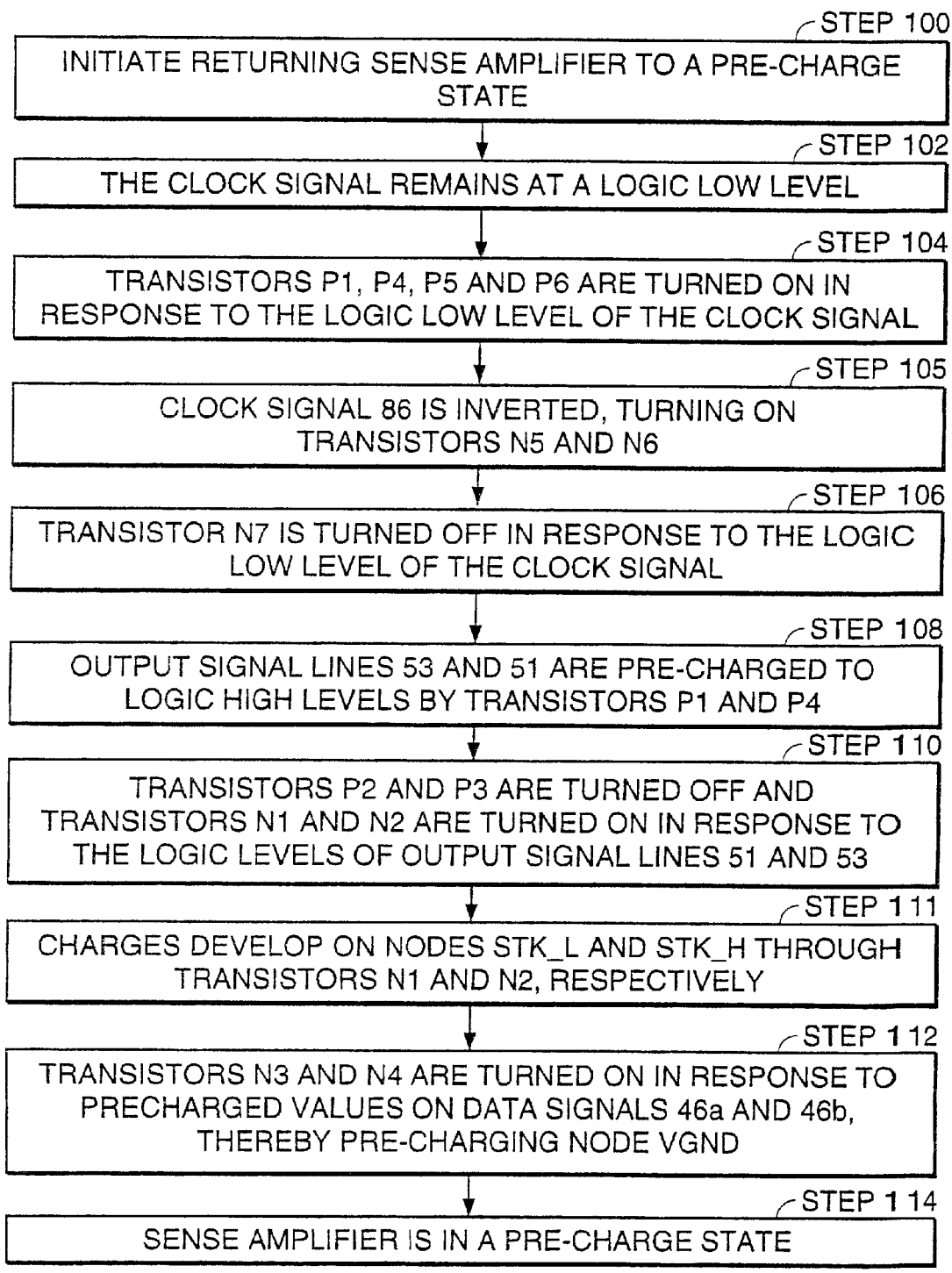
FIG. 5 is a flow diagram of the pre-charge operation of the sense amplifier of FIG. 4.

Referring now to the flow diagram of FIG. 5 and to the schematic diagram of FIG. 4, the pre-charge operation of sense amplifier 44 will be described. Sense amplifier 44 returns to a reset or "pre-charge" state between each sensing operation (Step 100). During such a pre-charge state, the input CLK_H signal 86 remains at a logic low level (Step 102). The CLK_H signal 86 conveys that logic low level to the gate of PMOS transistors P1, P4, P5 and P6, turning them "on" or, in other words, allowing current to flow from their source terminals to their drain terminals (Step 104). CLK_H signal 86 is inverted by inverter G1 such that NMOS transistors N5 and N6 are turned on at approximately the same time as PMOS transistors P5 and P6 (Step 105). Also, the gate terminal of NMOS transistor N7 is turned "off" in response to CLK_H signal 86 (Step 106). It should be noted that NMOS transistor N7 is referred to as the "evaluate" transistor and is only turned-on during the sensing operation, as will be described.

When transistors P1 and P4 are turned-on, signal lines preout_l 53 and preout_h 51 are charged to approximately the same voltage as Vdd, i.e. to logic high levels (Step 108). The logic high levels on signals preout_h 51 and preout_l 53 are conveyed to the gate terminals of PMOS transistors P2 and P3, which are turned-off, and to the gate terminals of NMOS transistors N1 and N2, which are turned-on (Step 110). When transistors N1 and N2 are turned-on, charge is developed on nodes STK_L and STK_H (Step 111).

Further, because signal lines data_in_h 47 and data_in_l 46 have previously been pre-charged by the circuits that generate them, a logic high level is conveyed to the gates of NMOS transistors N3 and N4, which are responsively turned-on (Step 112). Accordingly, signal VGND is pre-charged to a logic high level and sense amplifier 44 is referred to as being in a pre-charge state (Step 114).

V. Sense Amplifier Operation: Data_in_l Transitioning to a Low Logic Level

Figure 6:
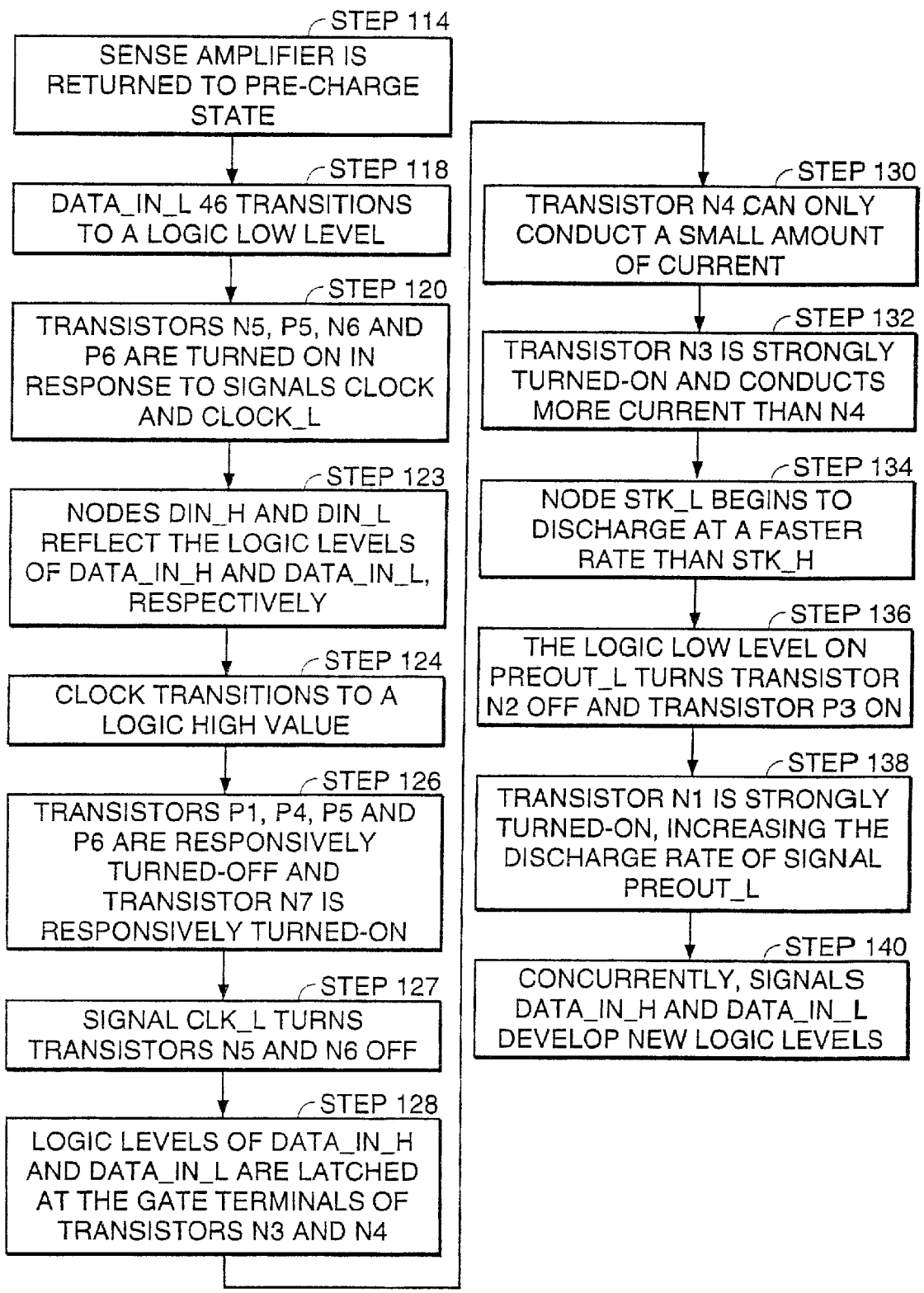
FIG. 6 is a flow diagram of the operation of the sense amplifier of FIG. 4.

Referring now to the flow diagram of FIG. 6, the operation of sense amplifier 44 will be shown in response to data_in_l 46 transitioning from a logic high level to a logic low level. Assuming that data_in_l 46 and data_in_h 47 are pre-charged to logic high levels, at a given point in time data_in_l 46 will transition to a logic low level while CLK_H signal 86 is still at a logic low level (Step 118).

Because signals CLK_H 86 and CLK_L 87 are at logic low and high levels respectively, transistors N5, P5, N6 and P6 are turned-on (Step 120) and nodes DIN_H and DIN_L reflect the logic levels of data_in_h 47 and data_in_l 46 (Step 123). Subsequently, CLK_H signal 86 transitions to a logic high level (Step 124). That logic high level is conveyed to PMOS transistors P1, P4, P5 and P6, turning them off and also to NMOS evaluate transistor N7, simultaneously turning it on (Step 126). Further, the complementary clock signal, CLK_L, is conveyed to NMOS transistors N5 and N6, turning them off (Step 127). Therefore, the logic levels of data_in_h 47 and data_in_l 46 are latched at the gate terminals of transistors N3 and N4 and data_in_h 47 and data_in_l 46 can begin to develop new logic levels (Step 128).

At this point in the cycle, the source terminals of NMOS transistors N3 and N4 have a path to Vss, through transistor N7. Because node DIN_L is at a logic low level, transistor N4 can only conduct a small amount of current (Step 130). However, because node DIN_H is at a logic high level, NMOS transistor N3 will be strongly turned-on and therefore conducts more current than transistor N4 (Step 132). Accordingly, node STK_L begins to discharge through transistors N3 and N7 at a faster rate than node STK_H is discharged through transistors N4 and N7. In response, signal preout_l 53 begins to discharge through transistor N1 at essentially the same rate as node STK_L (Step 134).

When signal preout_l 53 reaches a logic low level, it is conveyed to the gate terminal of transistor N2, which is responsively turned-off, and the gate terminal of transistor P3, which is responsively turned-on (Step 136). When transistor P3 is turned-on, it quickly raises preout_h 51 and the gate terminal of transistor N1 to a logic high level, thereby strongly turning transistor N1 on and further increasing the rate that signal preout_l 53 is discharged (Step 138). Thus, signal preout_l 53 is latched at a logic low level and signal preout_h 51 is latched at a logic high level.

Concurrently, signals data_in_h 47 and data_in_l 46 are able to develop new logic levels. In other words, sense amplifier 44 is receiving new data while signals preout_l 53 and preout_h 51 are being latched at their respective rail-to-rail voltages (Step 140). When CLK_H signal 86 again falls to a logic low level, those new logic levels will be conveyed to the gate terminals of transistors N3 and N4 and the sense operation will begin again.

VI. Sense Amplifier Operation: Data_in_h Transitioning to a Logic Low Level

Referring now to the flow diagram of FIG. 7, the operation of sense amplifier 44 will be described in response to signal data_in_h 47 transitioning from a logic high level to a logic low level. For illustration purposes, consider that the sense amplifier 44 has been returned to the reset or pre-charge state in the manner previously described (see FIG. 6) (Step 144). When sense amplifier 44 is in such a pre-charge state, the input CLK_H signal 86 is at a logic low level.

Before CLK_H signal 86 transitions from a logic low level to a logic high level, signal data_in_h 47 transitions to a voltage level that can be evaluated by sense amplifier 44 (Step 152). The CLK_H signal 86 subsequently transitions to a logic high level and is conveyed to the gate terminals of PMOS transistors P1, P4, P5 and P6, turning them off (Step 154). Also, NMOS transistors N5 and N6 are turned-off and transistor N7 is turned-on in response to the logic levels of signals CLK_L and CLK_H 86, respectively (Step 156). Because NMOS transistor N7 has its source terminal connected to Vss, node VGND begins to discharge to a logic low level (Step 158).

At this point in the cycle, NMOS transistor N4 is turned-on, and transistor N3 is turned-off (Step 160). Therefore, node STK_L cannot discharge through transistor N3 (Step 162) and node STK_H begins discharging through transistors N4 and N7 to Vss (Step 164). Also, signal preout_h 51 begins to discharge through transistor N2 (Step 166). When signal preout_h 51 achieves a sufficiently low voltage, PMOS transistor P2 is turned-on and begins to pull signal preout_l up to Vdd (Step 168). Subsequently, signals preout_l and preout_h continue to transition until they reach their resulting rail-to-rail voltages (Step 170).

Accordingly, the logic levels of signals data_in_l 46 and data_in_h 47 are mirrored by rail-to-rail voltage levels on signals preout_l 53 and preout_h 51, respectively. While those voltage levels are being generated, new logic levels are being developed on signals data_in_h 47 and data_in_l 46. Those new logic levels do not affect the generation of output signals 53 and 51 since pass-gates 77a and 77b are holding the previous logic levels at the gate terminals of transistors N3 and N4. Therefore, the performance of sense amplifier 44 is improved since the data hold timing requirement is significantly reduced. In other words, such a reduction in the data hold timing requirement allows data to be presented to sense amplifier 44 at an increased rate.

It will be recognized by one of ordinary skill in the art that the functionality of the inventive sense amplifier will be preserved if the NMOS and PMOS transistors are exchanged, along with the polarity of the associated logic signals. Further, the sense amplifier of the present invention is not limited to implementation in the read port of a RAM structure. To the contrary, the instant sense amplifier can be used in any circuit or application that utilizes a sense amplifier. For example, such circuits include edge-triggered latches and flip flops.

Figure 7:
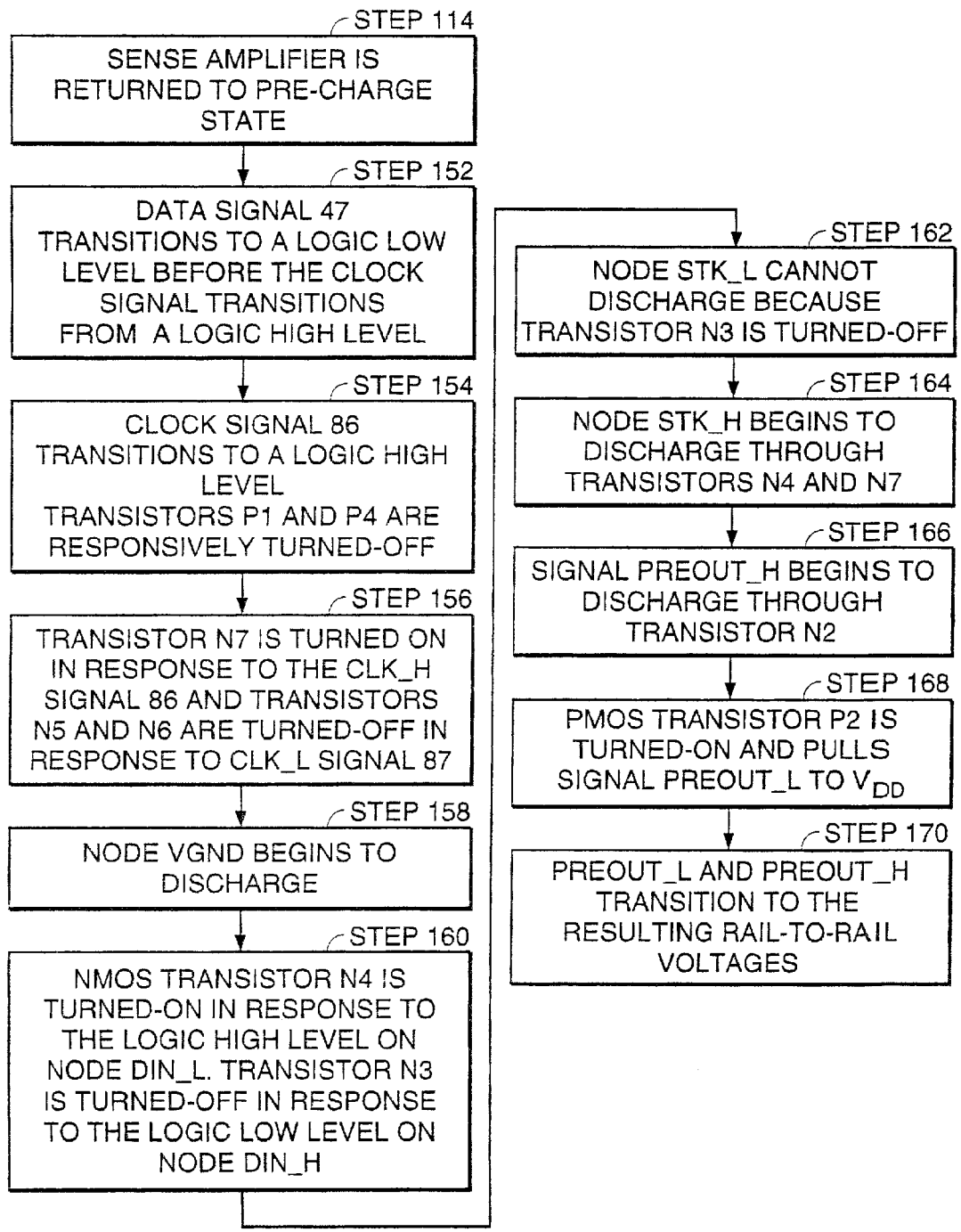
FIG. 7 is a flow diagram of a further operation of the sense amplifier of FIG. 4.
Figure 8:
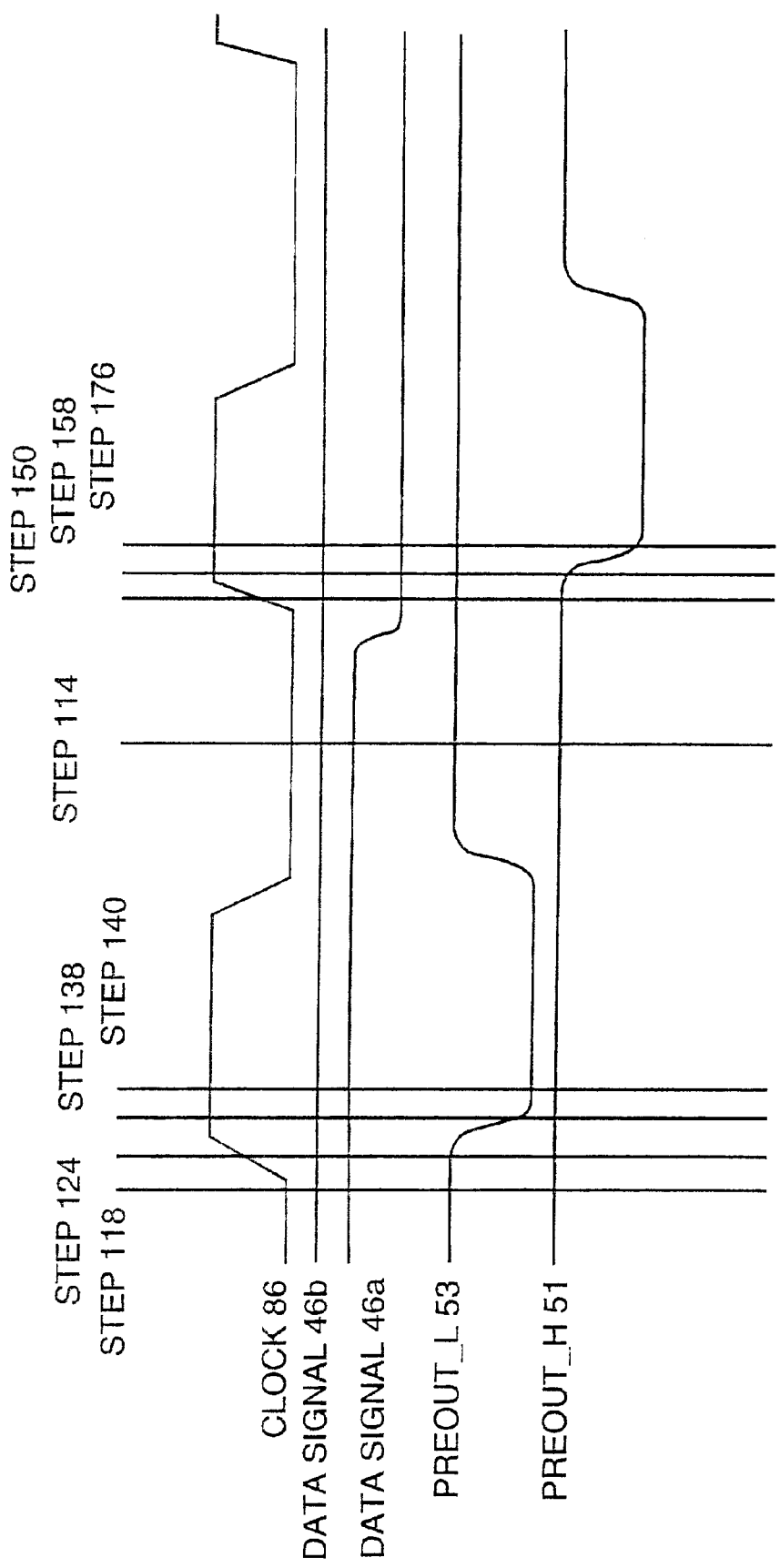
FIG. 8 is a timing diagram of the operation of the sense amplifier of FIG. 4.

Referring briefly to the timing diagram of FIG. 8, the timing waveforms of signals CLK_H 86, CLK_L 87, data_in_h 47, DIN_H, data_in_46, DIN_L, preout_1 53 and preout_b 51 are shown in relation to the corresponding operational steps of FIGS. 6 and 7.

VII. Alternative Embodiments of the Present Invention

Figure 9:
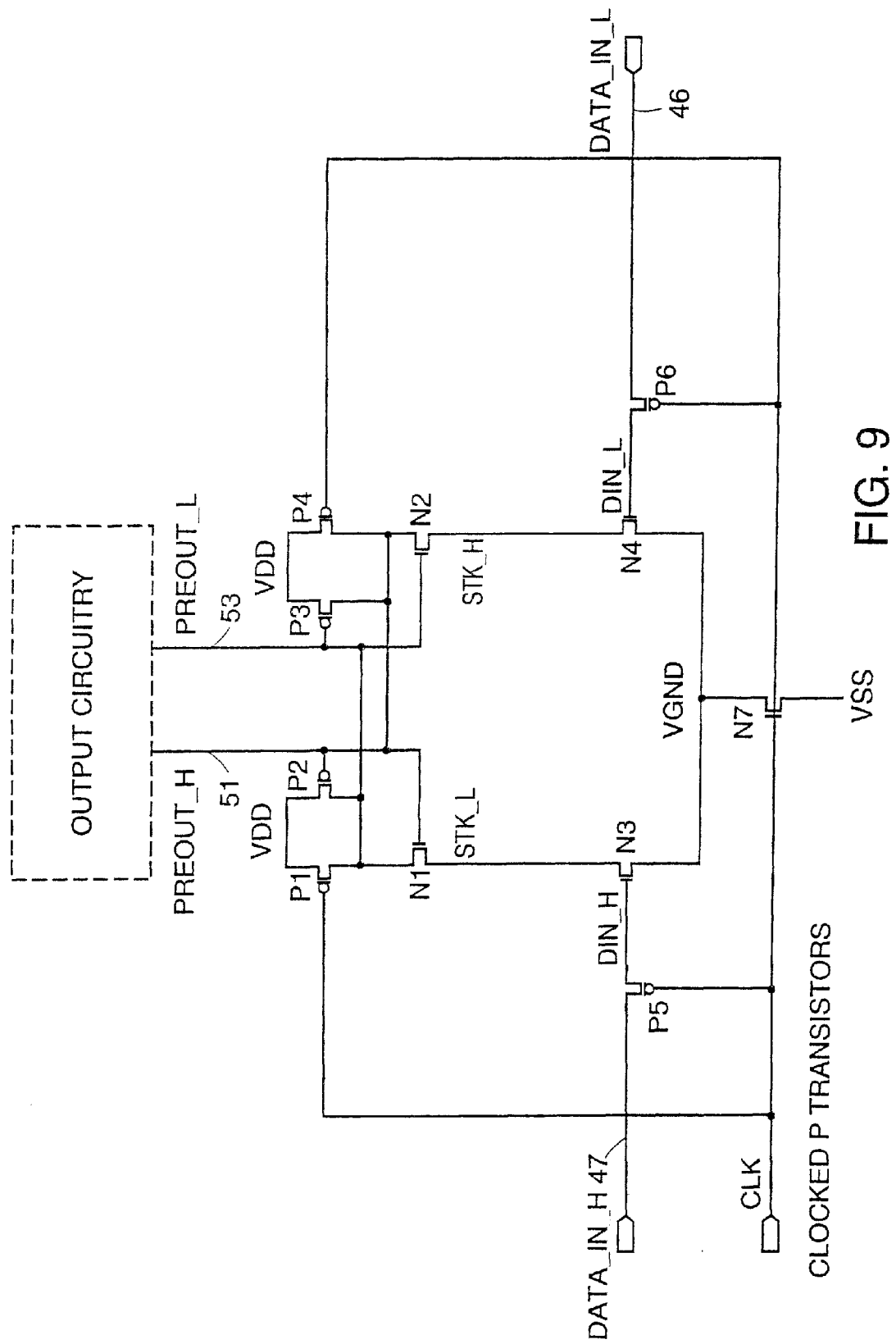
FIG. 9 is a schematic diagram of a further embodiment of the sense amplifier of FIG. 3, according to the present invention.

Referring now to FIG. 9, an alternative embodiment of sense amplifier 44 is shown. In the present embodiment, pass-gates 77a and 77b include PMOS transistors P5 and P6, respectively. With such an embodiment, the capacitance imposed on data signals data_in_h 47 and data_in_1 46 is reduced in relation to the previously described embodiment. That reduction is related to the amount of capacitance imposed by NMOS transistors N5 and N6 (See FIG. 4). The operation of the present embodiment is similar to that of the prior embodiment except that nodes DIN_H and DIN_L are driven by transistors P5 and P6. With such an embodiment, similar reductions in the data hold timing requirement are achieved.

Figure 10:
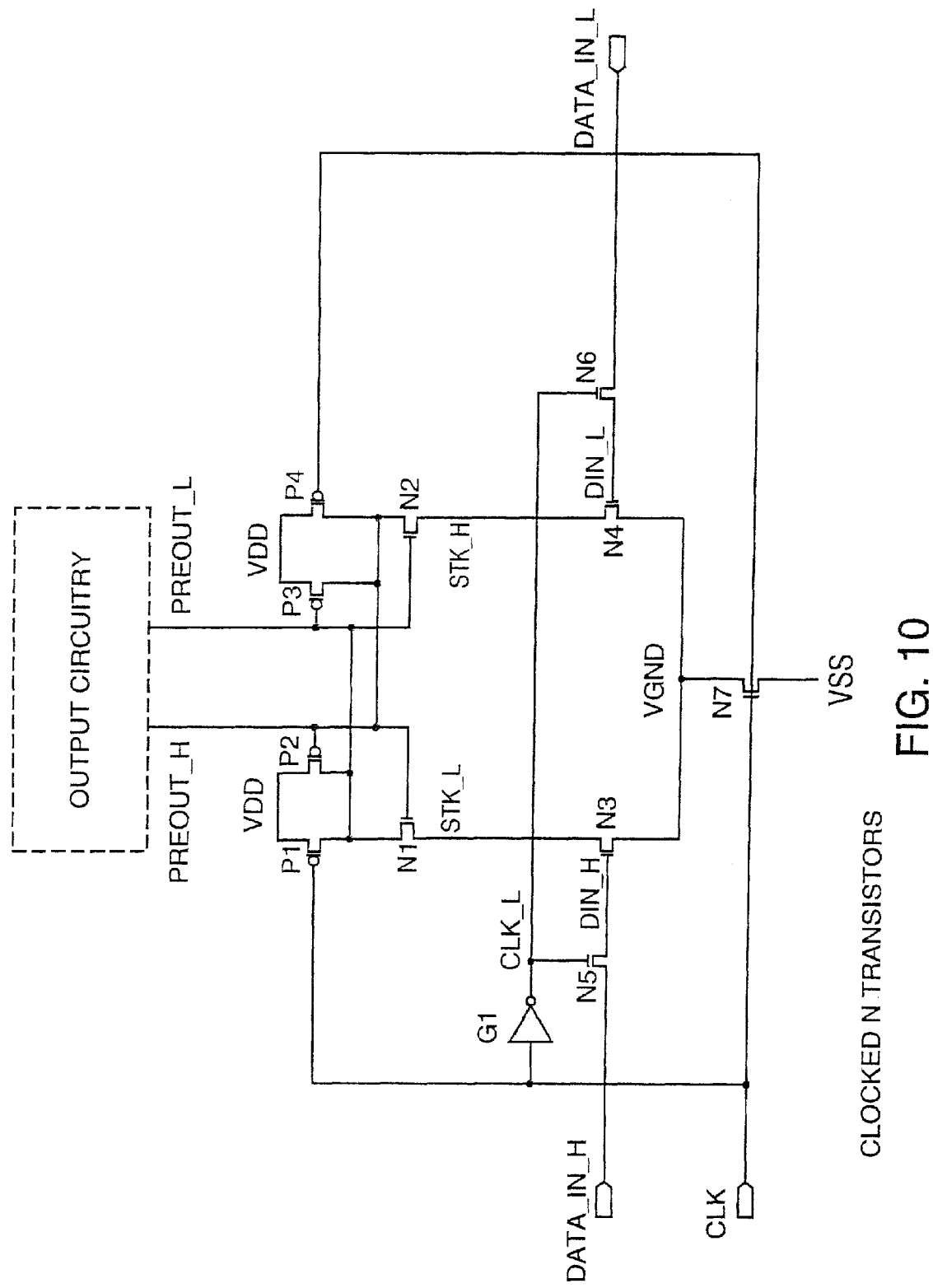
FIG. 10 is a schematic diagram of a still fluffier embodiment of the sense amplifier of FIG. 3, according to the present invention.

Referring now to FIG. 10, a further alternative embodiment of sense amplifier 44 is shown. In the present embodiment, pass-gates 77a and 77b include NMOS transistors N5 and N6, respectively. With such an embodiment, the capacitance imposed on data signals data_in_h 47 and data_in_1 46 is reduced in relation to the above mentioned embodiment. That reduction is related to the amount of capacitance imposed by PMOS transistors P5 and P6 (See FIG. 4). The operation of the present embodiment is similar to that of the prior embodiment except that nodes DIN_H and DIN_L are driven by transistors N5 and N6. With such an embodiment, similar reductions in the data hold timing requirement are achieved.

It should be noted that the present invention can be incorporated into the sense amplifier described in co-pending Application "A High Input Impedance Strobed CMOS Differential Sense Amplifier With Pre-Evaluate Charge Sharing on Complementary Nodes", invented by Daniel W. Bailey. Accordingly, the pass-gate input stages can be coupled to the gate terminals of that structure's input transistors. With such a structure, significantly increased performance due to a considerable reduction of the data hold timing requirement is provided.

It should further be noted that the present invention can be incorporated into the sense amplifier described in co-pending Application "A High Input Impedance Strobed CMOS Differential Sense Amplifier With Double Fire Evaluate", invented by Jeff L. Chu, Daniel W. Bailey, and Jason Cantin. Accordingly, the pass-gate input stages can be coupled to the gate terminals of that structure's input transistors. With such a structure, a significant reduction of the data hold timing requirement is provided.

It should also be recognized that the present invention is capable of being incorporated in sense amplifiers that receive data signals that embody low voltage swing signals, rail-to-rail voltage signals, TTL signals, or any other similar signal types where certain voltage levels represent certain logic levels such that data may be conveyed thereby.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An apparatus for improving an effective data hold timing requirement associated with a sense amplifier, comprising:
   a pass-gate for receiving a first logic level developed on a data signal and for latching said first logic level when a control signal is transitioned to a given assertion state, said first logic level being conveyed to said sense amplifier through said pass-gate; and
   said sense amplifier, for receiving said first logic level from said pass-gate and for generating a latched output signal in response to said first logic level, responsive to said pass-gate latching said first logic level and non-responsive to said data signal transitioning to a second logic level while said sense amplifier is generating said latched output signal.

2. The apparatus for improving said effective data hold timing requirement, as described in claim 1, wherein said pass-gate comprises:
   a level-sensitive latch that latches said first logic level in response to said given assertion state of said control signal being a predetermined voltage level.

3. The apparatus for improving said effective data hold timing requirement, as described in claim 2, wherein said pass-gate further comprises:
   first transistor having a drain terminal connected to said data signal, a source terminal connected to said sense amplifier and a gate terminal connected to said control signal such that said first transistor latches said first logic level when said control signal develops said predetermined voltage level.

4. The apparatus for improving said effective data hold timing requirement, as described in claim 3, wherein said first transistor is a PMOS transistor.

5. The apparatus for improving said effective data hold timing requirement, as described in claim 3, wherein said first transistor is an NMOS transistor.

6. The apparatus for improving said effective data hold timing requirement, as described in claim 3, wherein said pass-gate further comprises:
   a second transistor having a drain terminal connected to said data signal, a source terminal connected to said sense amplifier and a gate terminal connected to said control signal such that said second transistor latches said first logic level in response to a complementary version of said given assertion state.

7. The apparatus for improving said effective data hold timing requirement, as described in claim 6, wherein said first transistor is a PMOS transistor and said second transistor is an NMOS transistor.

8. An apparatus for improving an effective data hold timing requirement associated with a sense amplifier, comprising:
   a first pass-gate for receiving a first logic level developed on a first data signal and for latching said first logic level when a control signal is transitioned to a certain assertion state, said first logic level being conveyed to said sense amplifier through said first pass-gate;
   a second pass-gate for receiving a second logic level developed on a second data signal and for latching said second logic level when said control signal is transitioned to said certain assertion state, said second logic level being conveyed to said sense amplifier through said second pass-gate;

said sense amplifier, for receiving said first and second logic levels from said first and second pass-gates and for generating a latched output signal in response to said first and second logic levels, responsive to said first and second pass-gates latching said first and second logic levels and non-responsive to said first and second data signals transitioning to third and fourth logic levels, respectively, while said sense amplifier is generating said latched output signal.

9. The apparatus for improving an effective data hold timing requirement, as described in claim 8, wherein said sense amplifier comprises:

a first discharge path, coupled to a first internal signal of said sense amplifier, for allowing a charge stored on that first internal signal to be discharged at a first rate, said first rate being proportional to said first logic level conveyed to said first discharge path by said first pass-gate;

second discharge path, coupled to a second internal signal of said sense amplifier, for allowing a charge stored on that second internal signal to be discharged at a second rate, said second rate being proportional to said second logic level conveyed to said second discharge path by said second pass-gate.

10. The apparatus for improving an effective data hold timing requirement, as described in claim 9, wherein said sense amplifier further comprises:

a charge sharing device, coupled to said first internal signal and to said second internal signal for balancing a first charge, developed on said first internal signal, with a second charge, developed on said second internal signal, between times when said logic levels are imposed on said first and second data signals.

11. The apparatus for improving an effective data hold timing requirement, as described in claim 9, wherein said sense amplifier further comprises:

an evaluate unit, connecting said first and second discharge paths to an electrical ground, for conveying a first portion of said charges to said electrical ground at an initial rate and for conveying a second portion of said charges to said electrical ground at a subsequent rate, wherein said evaluate unit conveys said second portion of said charges to said electrical ground after a certain time delay has occurred since said first portion of said charges is conveyed to said electrical ground, such that said sensitivity of said sense amplifier is improved.

12. A computer system, comprising:

a central processing unit connected to a memory system by a system bus;

an I/O system, connected to the system bus by a bus interface device; and at least one sense amplifier, said sense amplifier coupled to a pass-gate for receiving a first logic level developed on a data signal and for latching said first logic level when a control signal is transitioned to a given assertion state, said logic level being conveyed to said sense amplifier through said pass-gate;

said sense amplifier, for receiving said logic level from said pass-gate and for generating a latched output signal in response to said logic level, responsive to said pass-gate latching said first logic level and non-responsive to said data signal transitioning to a second logic level while said sense amplifier is generating said latched output signal.

13. The computer system described in claim 12, wherein said pass-gate comprises:

a level-sensitive latch that latches said first logic level in response to said given assertion state of said control signal being a predetermined voltage level.

14. The computer system described in claim 13, wherein said pass-gate further comprises:

a first transistor having a drain terminal connected to said data signal, a source terminal connected to said sense amplifier and a gate terminal connected to said control signal such that said first transistor latches said first logic level when said control signal develops said predetermined voltage level.

15. The computer system described in claim 14, wherein said first transistor is a PMOS transistor.

16. The computer system described in claim 14, wherein said first transistor is an NMOS transistor.

17. The computer system described in claim 14, wherein said pass-gate further comprises:

a second transistor having a drain terminal connected to said data signal, a source terminal connected to said sense amplifier and a gate terminal connected to said control signal such that said second transistor latches said first logic level in response to a complementary version of said given assertion state.

18. The computer system described in claim 17, wherein said first transistor is a PMOS transistor and said second transistor is an NMOS transistor.

19. A computer system, comprising:

a central processing unit connected to a memory system by a system bus;

an I/O system, connected to the system bus by a bus interface device; and at least one sense amplifier, coupled to said central processing unit;

a first pass-gate, coupled to said sense amplifier, for receiving a first logic level developed on a second data signal and for latching said first logic level when a control signal is transitioned to a certain assertion state, said first logic level being conveyed to said sense amplifier through said first pass-gate;

a second pass-gate, coupled to said sense amplifier, for receiving a second logic level developed on a first data signal and for latching said second logic level when said control signal is transitioned to said certain assertion state, said second logic level being conveyed to said sense amplifier through said second pass-gate;

said sense amplifier, for receiving said first and second logic levels from said first and second pass-gates and for generating a latched output signal in response to said first and second logic levels, responsive to said first and second pass-gates latching said first and second logic levels and non-responsive to said first and second data signals transitioning to third and fourth logic levels, respectively, while said sense amplifier is generating said latched output signal.

20. The computer system, as described in claim 19, wherein said sense amplifier comprises:

a first discharge path, coupled to a first internal signal of said sense amplifier, for allowing a charge stored on that first internal signal to be discharged at a first rate, said first rate being proportional to said first logic level conveyed to said first discharge path by said first pass-gate;

a second discharge path, coupled to a second internal signal of said sense amplifier, for allowing a charge stored on that second internal signal to be discharged at a second rate, said second rate being proportional to said second logic level conveyed to said second discharge path by said second pass-gate.

21. The computer system described in claim 20, wherein said sense amplifier further comprises:

a charge sharing device, coupled to said first internal signal and to said second internal signal for balancing a first charge, developed on said first internal signal, with a second charge, developed on said second internal signal, between times when said logic levels are imposed on said first and second data signals.

22. The computer system described in claim 20, wherein said sense amplifier further comprises:

an evaluate unit, connecting said first and second discharge paths to an electrical ground, for conveying a first portion of said charges to said electrical ground at an initial rate and for conveying a second portion of said charges to said electrical ground at a subsequent rate, wherein said evaluate unit conveys said second portion of said charges to said electrical ground after a certain time delay has occurred since said first portion of said charges is conveyed to said electrical ground, such that said sensitivity of said sense amplifier is improved.

23. A method for latching a first logic level, developed on a data signal that is presented to a sense amplifier, such that an effective data hold timing requirement associated with that sense amplifier is improved, comprising the steps of:

receiving, by a pass-gate, said logic level of said data signal;

placing said pass-gate in a first mode in response to a first assertion level of a clock signal, such that said first logic level of said data signal is conveyed to said sense amplifier through said pass-gate;

placing said pass-gate in a second mode in response to a second assertion level of a clock signal, such that said first logic level of said data signal is latched while said sense amplifier senses said first logic level; and developing a second logic level on said data signal while said sense amplifier senses said first logic level and while said sense amplifier responsively generates a corresponding latched output signal, such that said effective data hold timing requirement imposed on said data signal is improved.

24. The method for latching said first logic level developed on said data signal, as described in claim 23, wherein said step of placing said pass-gate in said first mode comprises the steps of:

turning-on a first transistor that has a drain terminal connected to said data signal such that said first logic level is developed on a source terminal of said first transistor; and turning-on a second transistor, at the same time as said first transistor, that has a drain terminal and a source terminal connected to the drain and source terminals of said first transistor, respectively, such that said first logic level is developed on source terminal of said second transistor.

25. The method for latching said first logic level developed on said data signal, as described in claim 24, wherein said step of placing said pass-gate in said second mode comprises the steps of:

turning-off said first transistor such that said first logic level is latched on said source terminal of said first transistor; and turning-off said second transistor such that said first logic level is latched on said source terminal of said second transistor and such that said second logic level can be developed on said data signal without affecting said latched version of said first logic level.

26. The method for latching said first logic level developed on said data signal, as described in claim 25, wherein said pass-gate is a level sensitive latch and said sense amplifier is an edge triggered latch.

27. The method for latching said first logic level developed on said data signal, as described in claim 26, wherein said pass-gate includes said first transistor and said second transistor connected in parallel.

28. An apparatus for improving an effective data hold timing requirement associated with a sense amplifier, comprising:

pass-gate means for receiving a first logic level of a data signal;

means for placing said pass-gate means in a first mode in response to a first assertion level of a clock signal, such that said first logic level of said data signal is conveyed to said sense amplifier through said pass-gate means;

means for placing said pass-gate means in a second mode in response to a second assertion level of a clock signal, such that said first logic level of said data signal is latched while said sense amplifier senses said first logic level; and means for developing a second logic level on said data signal while said sense amplifier senses said first logic level and while said sense amplifier responsively generates a corresponding latched output signal, such that said effective data hold timing requirement imposed on said data signal is improved.

29. The apparatus of claim 28, wherein said step of placing said pass-gate in said first mode comprises the steps of:

means for turning-on a first transistor that has a drain terminal connected to said data signal such that said first logic level is developed on a source terminal of said first transistor; and means for turning-on a second transistor, at the same time as said first transistor, that has a drain terminal and a source terminal connected to the drain and source terminals of said first transistor, respectively, such that said first logic level is developed on said source terminal of said second transistor.

30. The apparatus of claim 29, wherein said step of placing said pass-gate in said second mode comprises the steps of:

means for turning-off said first transistor such that said first logic level is latched on said source terminal of said first transistor; and means for turning-off said second transistor such that said first logic level is latched on said source terminal of said second transistor and such that said second logic level can be developed on said data signal without affecting said latched version of said first logic level.

31. The apparatus of claim 30, wherein said pass-gate means is a level sensitive latch and said sense amplifier is an edge triggered latch.

32. The apparatus of claim 31, wherein said pass-gate means includes said first transistor and said second transistor connected in parallel.

* * * * *